United States Patent [19]

Bhuva et al.

[11] Patent Number: 4,727,514

[45] Date of Patent: Feb. 23, 1988

[54] PROGRAMMABLE MEMORY WITH MEMORY CELLS PROGRAMMED BY ADDRESSING

[75] Inventors: Rohit L. Bhuva; Allen Y. Chen, both of Plano, Tex.

[73] Assignee: Texas Instruments Incorporated, Dallas, Tex.

[21] Appl. No.: 828,469

[22] Filed: Feb. 11, 1986

[51] Int. Cl.⁴ ............................................. G11C 17/00
[52] U.S. Cl. ..................................... 365/104; 365/96; 365/189
[58] Field of Search .................. 365/96, 103, 104, 94, 365/189, 230

[56] References Cited

U.S. PATENT DOCUMENTS

| | | | |
|---|---|---|---|
| 4,130,889 | 12/1978 | Chua | 365/96 |
| 4,347,584 | 8/1982 | Fukushima et al. | 365/104 |
| 4,385,368 | 5/1983 | Principi et al. | 365/96 X |
| 4,646,264 | 2/1987 | Matsuzaki | 365/104 |

Primary Examiner—Joseph A. Popek
Attorney, Agent, or Firm—Thomas R. FitzGerald; Leo N. Heiting; Melvin Sharp

[57] ABSTRACT

A programmable memory includes a memory matrix (34) with a row decode circuit (36) and a column decode circuit (48) operable in the program mode to select one of the memory elements in the memory matrix (34). A current boost circuit (50) is operable to provide increased current to the selected cell such that selection of the cell opens the fuse associated therewith to change the logic state. The pins associated with the column and row addresses have multiple mode functions such that in the normal operating mode they can be assigned other tasks and in the programming mode are utilized primarily for addressing of the memory cells.

16 Claims, 7 Drawing Figures

PROGRAMMABLE MEMORY WITH MEMORY CELLS PROGRAMMED BY ADDRESSING

TECHNICAL FIELD OF THE INVENTION

The present invention pertains in general to semiconductor memories and, more particularly, to programmable array logic matrices.

BACKGROUND OF THE INVENTION

Programmable array logic (PAL) matrices utilize a semiconductor matrix having transistors arranged in rows and columns with fusible links between the emitter of the transistors and the bit line. The matrix has a programmable mode and an operating mode. In the programmable mode, it is necessary to select ones of the memory cells for programming by passing an increased level of current through the select memory cell to change the logic state. In order to select a memory cell, column and row decoders are provided on the chip for activation in the programming mode. In the operating mode, different inputs are utilized by multiplexing the pins to select predetermined rows and/or columns for combination with output logic circuitry to provide an output. This output is a function of the arrangement of memory cells and the logic state thereof that are interfaced with the particular output.

In the programming mode, it is necessary to receive the row and column addresses on predetermined pins for selecting a given row and column. The current through the select memory cell is then increased by raising the voltage on the associated output line that is interfaced with the associated column or bit line to break down an internal zener and increase the current through the select memory cell. This has a disadvantage in that the number of memory cells that can be programmed for a particular row and column address is determined by the number of output pins.

In a typical system, the memory cells are arranged in groups of programmed words such that one row from each group is associated with one output pin through associated output logic circuitry. In the operating mode, any number of word lines can be activated such that the memory cells associated therewith are interconnected with respective bit lines for interface with the output logic circuitry. However, in the programming mode, it is necessary to be able to select each memory cell for programming. To this end, a single word line is activated with the use of a row decoder and an associated input row address with a bit line selected from each group of memory cells for interface with the output pin. The output pin then has its voltage increased to break down the internal zener diode and supply additional current to the memory cell if the memory cell is to be opened. Therefore, with the use of the column decoder, the row decoder and the presence or absence of a high voltage on the output pin, each memory cell can be selectively programmed.

One of the primary disadvantages with prior art systems in the programming mode is that they require a predetermined number of pins for programming. In the operating mode, it may not be necessary to utilize this large number of pins to provide the desired logic function and, therefore, the additional pins would be required only for programming and would be useless after programming. For example, in a 32×64 having eight output pins, it is necessary to have five row decode pins for selecting one of thirty-two word lines and three column address lines for providing a three-bit column address for selecting among eight groups of the sixty-four bit lines with bit lines arranged in eight groups of eight-bit lines each. Each column address selects one bit line out of each of the eight groups for programming and the associated output pin provides an interface to the exterior of the package to allow the input of a programming voltage for each group. The programming voltage, of course, is required only if the fuse is to be opened. If it is to be closed, no program voltage is applied. A disadvantage to this system is that if more than 2048 memory cells are in the memory array, additional pins must be added in order to select and program the memory cells. Another disadvantage is the problem for emitter coupled logic circuits (ECL circuits) of raising the voltage of a selected output pin in selecting the cell for programming in a group of cells corresponding to that output pin. Typically, the latter voltage is about 10 volts and exceeds the breakdown voltage of ECL circuits. Therefore, there exists a need for improved techniques to select and program memory cells in a programmable memory matrix without raising the voltage on the output pins and without requiring additional pins.

SUMMARY OF THE INVENTION

The present invention disclosed and claimed herein comprises a programmable memory which includes a matrix of programmable memory cells arranged in rows and columns, each cell storing first and second logic states. In the program mode, row and column address decoders are provided for receiving external row and column addresses for selecting one of the memory cells for programming to the second logic state. Programming circuitry is provided for applying increased current to the memory cells when accessed. Therefore, a memory cell is programmed to the second logic state when it is accessed by external row and column addresses without the need to apply a high voltage to any of the output lines for selection of a given cell.

In another embodiment of the present invention, the memory cells are comprised of transistors having an emitter to collector path and a fuse disposed in series therewith. The memory cell is operable to connect a reference voltage to a bit line which has a sense amp associated therewith for sinking current to ground. The programming circuitry provides an increased current in the sense amp such that, upon selection, the accessed memory cell is programmed to the second logic state.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
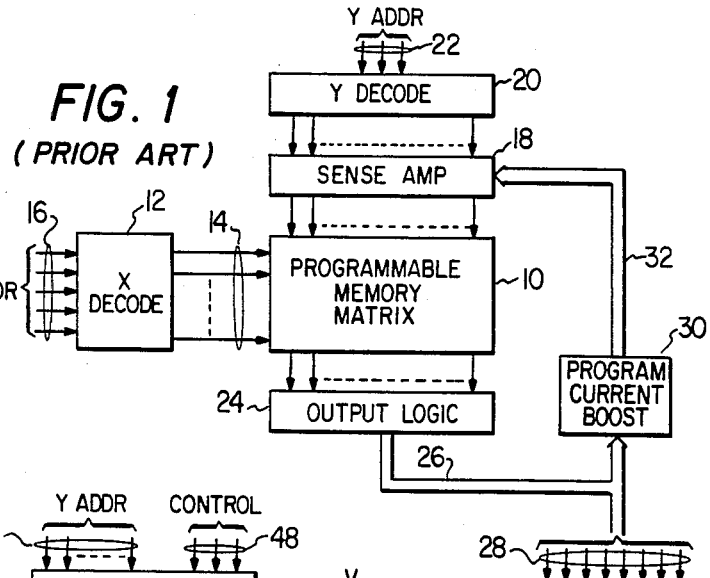
FIG. 1 illustrates a schematic block diagram of a prior art programmable memory matrix.

Referring now to FIG. 1, there is illustrated a schematic block diagram of a prior art programmable memory matrix in the programming mode. The memory includes a programmable memory matrix 10 which has a plurality of programmable memory cells arranged in rows and columns. Each of the rows of memory cells is connected to an X-decoder 12 through word lines 14. The X-decoder 12 is input thereto an X-address on address lines 16. In the illustrated embodiment, there are thirty-two rows and sixty-four columns.

Each of the bit lines associated with each of the columns is interfaced with a sense amp 18 and a Y-decoder 20 to receive a Y-address on Y-address lines 22 for decoding and activation of appropriate sense amps. Only a three-bit address is utilized to select eight individual bit lines at a time. Each of the bit lines is interfaced with an output logic circuit 24 for output on a bus 26 to output pins 28. In the device of FIG. 1, there are eight individual output pins 28 illustrated. A typical logic circuit could be an eight input OR gate. The bit lines in the matrix 10 are arranged in eight groups of eight each with the output logic circuit 24 comprises of eight OR gates. A given Y-address will select one bit line from each of the eight groups, each being output to one of the OR gates in the logic circuit 24 and, subsequently, each OR gate being associated with one of the output pins 28.

In order to program the selected memory cells, a program current boost circuit 30 is provided which is interfaced on the input thereof to the bus 26 and on the output thereof interfaced with the sense amp 18 through a bus 32. The program current boost is essentially a zener diode which breaks down at a higher voltage than the operating voltage of the device and increases the current through the sense amp associated with the selected ones of the bit lines. Therefore, when eight bit lines are selected, eight memory cells are also selected. By selectively increasing the voltage on the output pins 28, the logic state of the memory cell can be altered by opening an internal fuse. This therefore requires an X-address, a Y-address and a programming address on the output pins to program the particular memory cells. It should be understood that the inputs utilized to program the memory matrix are not necessarily the input pins utilized in the normal operating mode nor are the X- and Y-decode circuits 12 and 20 necessarily utilized to select memory cells in normal operating mode.

Figure 2:
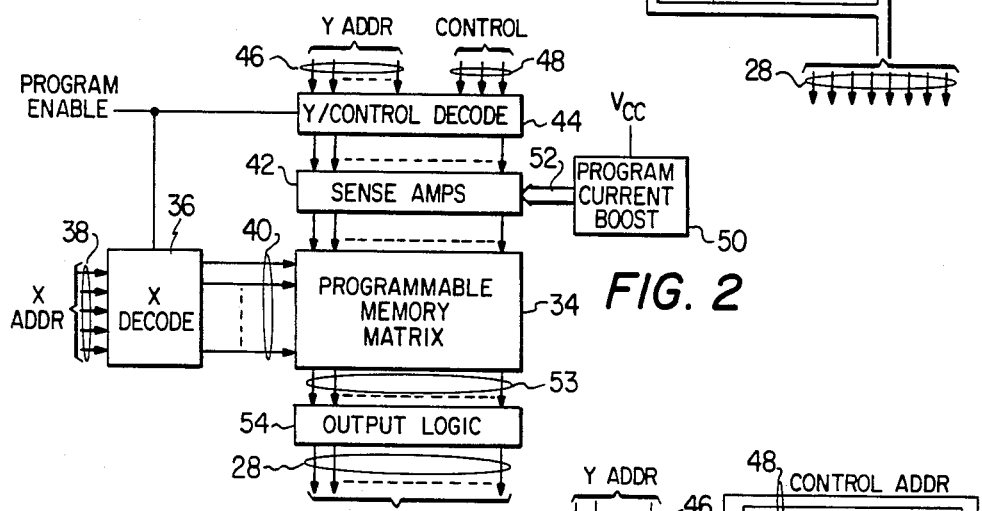
FIG. 2 illustrates a schematic block diagram of a programming technique for the present invention.

Referring now to FIG. 2, there is illustrated a schematic block diagram of the programmable memory matrix of the present invention illustrated in the programming mode. As described above, it should be understood that the configuration for the programming mode may be different from that for the operating mode wherein the pins to the device are multiplexed to provide multiple functions. The programmable memory includes a programmable memory matrix 34 similar to the programmable memory matrix 10 of FIG. 1. An X-decoder 36 is provided for decoding an X-address input on address lines 38 for providing a mutually exclusive output to each of the word lines 40. Sense amps 42 are provided for connection to each of the bit lines in matrix 34 with each of the sense amps selected by a Y/control decoder 44. The Y/control decoder 44 receives on the input thereof a Y-address on Y-address lines 46 and a control address on control address lines 48. However, it should be understood that the Y-address and control address are combined to provide a single address for each of the bit lines in the matrix 34. The Y-address and control address are separated to illustrate that additional addresses are provided in the control address to select each of the bit lines individually during programming as opposed to groups of addresses.

A program current boost circuit 50 is provided which is interfaced with sense amps 42 through lines 52. The program current boost circuit 50 is also interfaced with $V_{CC}$ and is operable to provide current whenever $V_{CC}$ is increased over an internal zener breakdown voltage. In an important aspect of the present invention, the program current boost is provided to control the voltage on the device and does not require selection of one of the output pins for application at the higher programming voltage thereto. It is then only necessary to select the address of the desired memory cell for programming thereof to change the logic state by opening the fuse. If the fuse is not to be opened, it is only necessary not to select the memory cell.

In the operational mode, an output logic circuit 54 is provided for receiving all of the bit lines and performing a predetermined logic function thereon for output to output pins 28. The output logic circuit 54 performs any number of logic functions. For example, it could be a series of multiple input OR gates to receive predetermined ones of bit line for combining together with an OR function for connection to one of the output pins. In the embodiment of FIG. 2, the output pins are not utilized during the programming mode and it is only necessary to provide an X- and a Y-address and increase the voltage on $V_{CC}$ to above the internal zener breakdown voltage to program the memory diode. Although not shown, the pins to which the X- and Y-address input lines 38 and 46, respectively, are interconnected is controlled by a program enable signal. The program enable signal controls the x-decode circuit 36 and Y/control decoder circuit 44 to allow for individual selection of memory elements in the programmable memory matrix 34. After entering the program mode, it is only necessary to sequence through the addresses of the memory elements to have the logic state thereof changed, it being understood that the memory elements in the matrix 34 normally exist at a first logic state.

Figure 3:
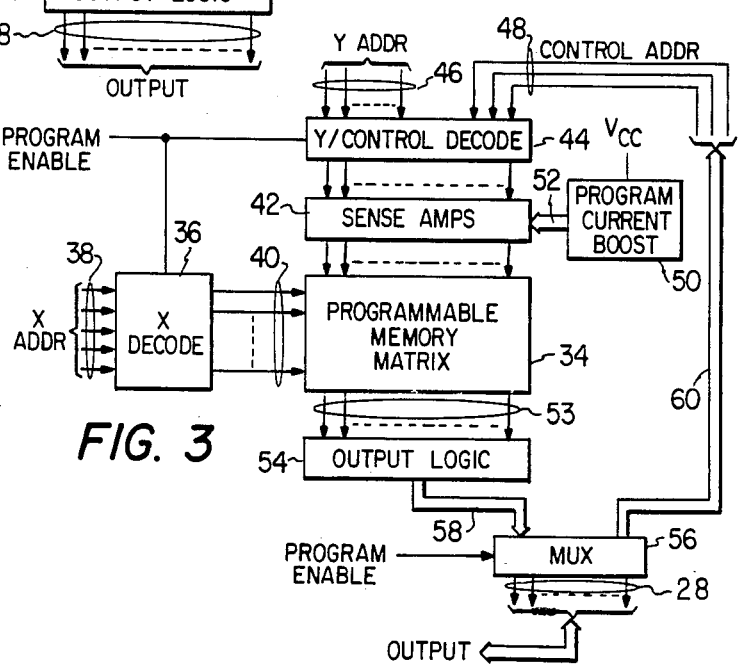
FIG. 3 illustrates an alternate embodiment utilizing multiplexing of the output pins.

Referring now to FIG. 3, there is illustrated an alternate embodiment of the memory of FIG. 2, wherein like numerals refer to like parts in the two figures. The embodiment of FIG. 3 multiplexes the output pins 28 through a multiplexer 56 to the control address line 48. The multiplexer 56 is connected to the output logic circuitry 54 through a bus 58 during normal operation and through a bus 60 to the control address lines 48. The multiplexer 56 is controlled by the program enable signal.

In operation, the programming mode is entered by enabling the X-decoder 36 and the Y/control decoder 44 to receive the X-address and the combined Y-address and control address. The voltage $V_{CC}$ is raised up above the internal zener breakdown voltage to provide the programming current and then a row is selected with the X-address and a column selected with the combination of the Y-address and control address. The Y- address lines 46 are interfaced with individual external pins whereas the control address lines 48 are interfaced through the multiplexer 56 to the output pins. The configuration of FIG. 3 therefore allows the circuit designer to utilize the output pins for addressing of memory elements. This is to be compared with prior art systems which required the output pins for providing programming current to individual bit lines. For example, if eight output pins were present, this would allow an eight bit binary word to be input to the Y/control decoder 44. In fact, no Y-address lines 46 need be utilized if only 256 columns are present. If a large memory is utilized, additional pins can be allocated to the Y-address function. The important aspect of the present invention is the individual selection of the memory elements with separate row and column addressing without requiring the programming current to be input on the output pins.

Figure 4:
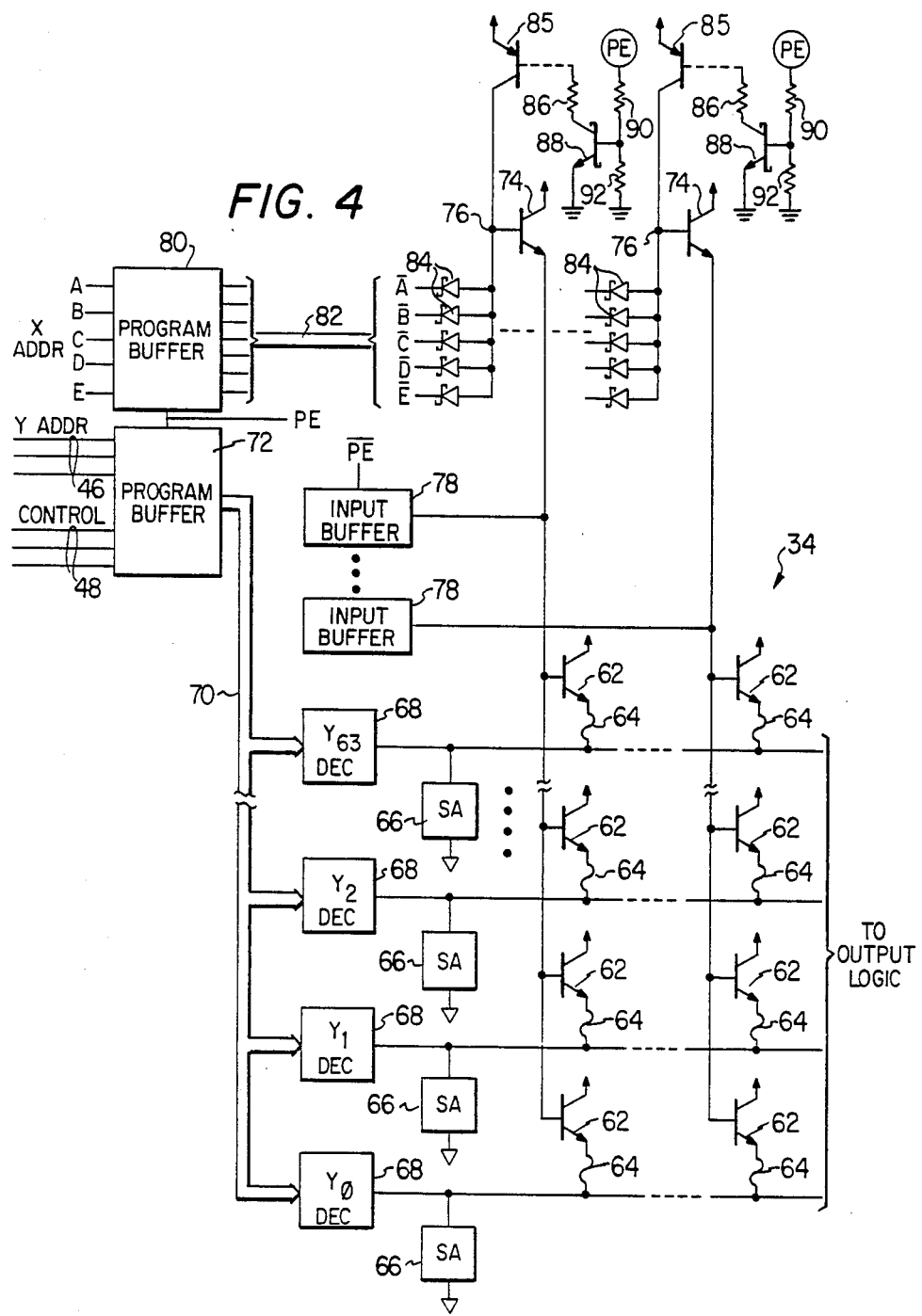
FIG. 4 illustrates a schematic diagram of the programmable memory matrix and associated decoders for the programming mode.

Referring now to FIG. 4, there is illustrated a schematic block diagram of the memory matrix 34 and the associated X- and Y-decoders and sense amps. The memory matrix 34 is comprised of a plurality of memory elements arranged in rows and columns. Each memory element consists of an NPN transistor 62 having the collector thereof connected to $V_{CC}$, the base thereof connected to a respective word line and the emitter thereof coupled to the respective bit line through a series fuse 64. Each of the bit lines is connected to ground through a sense amplifier 66 which is operable to sink current from the bit line through the activated one of the memory cells. The sense amplifier 66 senses the presence of current which occurs only if the fuse 64 is intact. If the fuse 64 is not intact, this is indicated on the bit line.

Each of the bit lines is connected with a separate decoder which selects the bit line in response to the combined Y-address and control address on lines 46 and 48, respectively. These address inputs are connected to an internal address bus 70 through a program buffer 72 to provide a binary address to a decoder 68. As described above, the buffer 72 is operable to select the pins associated with the Y-address and control address lines 46 and 48, respectively, during programming for the addressing function.

Each of the word lines connected to the bases of the memory cell transistors 62 is connected to the emitter of an NPN transistor 74, the collector of which is connected to $V_{CC}$ and the base of which is connected to a node 76. Transistor 74 is operable to provide current when in the programming mode to the respective word lines. In the operational mode, each of the word lines is connected to an input pin through an input buffer 78 for selection thereof. Although not shown, the input buffer 78 and the program buffer 72 can share common pins with the buffers 72 and 78 providing a multiplexing operation.

The node 76 is connected to an X-address program buffer 80 through decode lines 82. The decode lines 82 are connected to the node 76 through diode 84. Diode 84 is operable to pull the base 76 low when any one of the diodes 84 are connected low.

A PNP transistor 85 has the collector thereof connected to node 76 and the emitter thereof connected to $V_{CC}$. The base of transistor 85 is connected through a resistor 86 through an NPN transistor 88 to ground with the base of transistor 88 being connected to the program enable signal through a resistor 90 and to ground through a resistor 92. Transistor 88 is operable to turn on transistor 85 in the program mode and source current to node 76 to turn on transistor 74 if none of the diodes 84 have the cathodes thereof connected to ground. To determine the decode operation for each of the word lines, each diode is physically connected to the true or compliment form of the X-address in accordance with a predetermined decode pattern.

In operation, the program buffers 72 and 80 are configured in the program mode to interconnect respective pins on the device to provide the X-address and the combined Y-address and control address to select one of the memory cells. The Y-decoder 68 and the sense amp 66 are controlled to provide additional current during this mode when one of the memory cells is selected such that the fuse 64 is opened due to increased current, as will be described hereinbelow.

Figure 5:
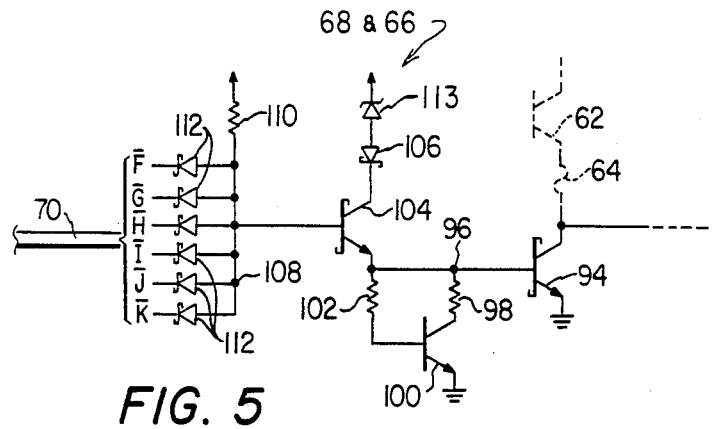
FIG. 5 illustrates a schematic block diagram of the sense amplifier and Y-decoders.

Referring now to FIG. 5, there is illustrated a schematic diagram of the Y-decoder 68 and sense amp 66. The sense amp is comprised of a current source which consists of an NPN transistor 94 having the collector thereof connected to a respective bit line, the emitter thereof connected to ground and the base thereof connected to a node 96. The node 96 is connected through a resistor 98 to the collector of an NPN transistor 100 and through a resistor 102 to the base of transistor 100 with the emitter of transistor 100 connected to ground. Current is supplied to node 96 to turn on transistor 94 through a series transistor 104 with the emitter thereof connected to node 96, the collector thereof connected to the cathode of a diode 106 and the base thereof connected to a node 108. Node 108 is connected to $V_{CC}$ through a resistor 110 and also to the decode lines 70 through diodes 112. When one of the decode lines 70 is low, this pulls node 108 low to turn off transistor 104 to provide the decode operation. The diodes 112 for each Y-decoder 68 are connected in a predetermined pattern to the true or compliment of the combined Y-address and control address.

The anode of diode 106 is connected to the anode of a zener diode 113, the cathode of which is connected to $V_{CC}$. In operation, transistor 104 conducts through the emitter thereof with the collector thereof isolated for normal operating voltages. However, when $V_{CC}$ is raised to a voltage that exceeds the breakdown voltage of zener diode 113, current flows through the collector-emitter of transistor 104 to increase the current through transistor 94 and, thus, open fuse 64 if the associated transistor 62 is turned on. Therefore, by inputting the appropriate combined Y-address and control address to diodes 112, the bit line will be selected to provide an increased current to the transistor 94 and an increased current through associated fuse 64 if connected in accordance with the X-address. In the normal operating mode, none of the diodes 112 are connected to ground and, thus, current is supplied from $V_{CC}$ through resistor 110 to the base-emitter junction of transistor 104 to maintain transistor 94 in a limited current mode to prevent opening of connected fuse 64.

Figure 6:
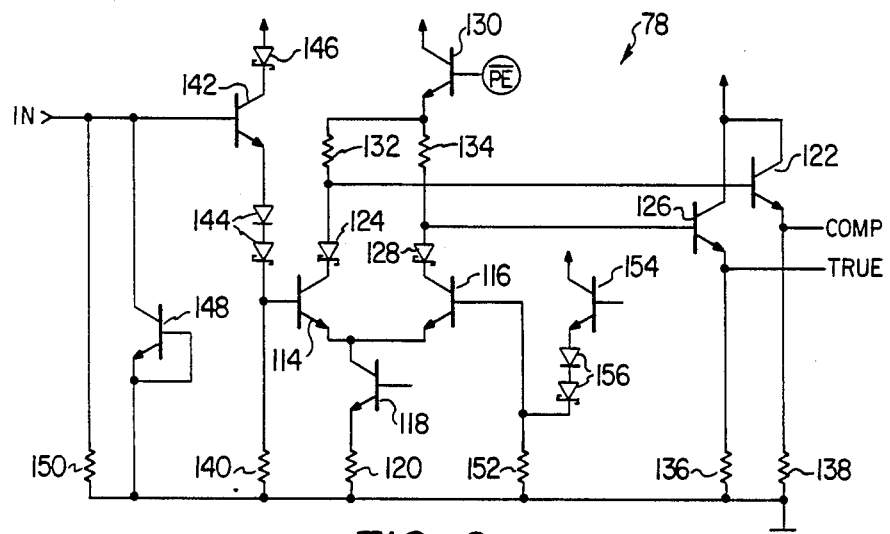
FIG. 6 illustrates a schematic diagram of the program buffer.

Referring now to FIG. 6, there is illustrated a schematic diagram of the input buffer 78. Two NPN transistors 114 and 116 have the emitters thereof connected to the collector of a transistor 118, the emitter of which is connected to ground through a resistor 120. The collector of transistor 114 is connected to the base of an NPN transistor 122 through a series diode 124 and the collector of transistor 116 is connected to the base of an NPN transistor 126 through a series connected diode 128. The base of transistor 122 is connected to the emitter of an NPN transistor 130 through a resistor 132 and the base of transistor 126 is also connected to the emitter of transistor 130 through a resistor 134. Transistor 130 has the collector thereof connected to $V_{CC}$ and the base thereof connected to the inverse of the program enable signal. Transistors 122 and 126 have the collectors thereof connected to $V_{CC}$ with the emitter of transistor 126 connected to ground through a resistor 136 and the emitter of transistor 122 connected to ground through a transistor 138.

The base of transistor 114 is connected to ground through a resistor 140 and to the emitter of an NPN transistor 142 through two series connected diodes 144 with the collector of transistor 142 connected to $V_{CC}$ through a series diode 146 and the base thereof connected to the input pin. A transistor 148 is connected between the base of transistor 142 and ground, and configured as a diode with the base thereof connected to the emitter thereof. The base of transistor 142 is also connected to ground through a resistor 150. Transistor 116 has the base thereof connected to ground through a resistor 152 and to the emitter of a transistor 154 through two series connected diodes 156, the collector of transistor 154 being connected to $V_{CC}$ and the base thereof connected to a voltage reference ($V_R$).

In operation, the emitter of transistor 122 provides the compliment output of the input signal and the emitter of transistor 126 provides the true output thereof. Transistor 130 operates as a switch to provide current to the base of transistors 122 and 126 in the operating mode and, in the programming mode, transistor 130 is turned off to subsequently turn off transistor 122 and 126 to allow the emitters thereof to float.

Figure 7:
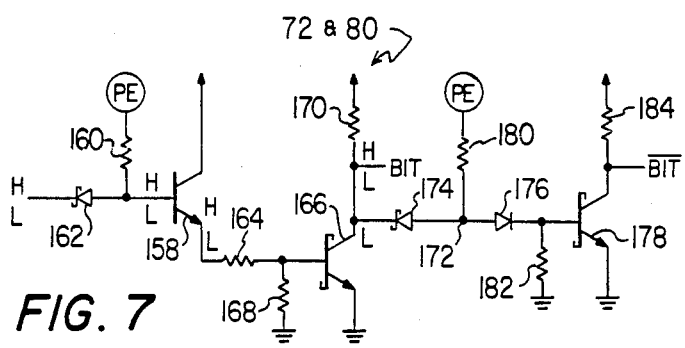
FIG. 7 illustrates a schematic diagram of the input buffer.

Referring now to FIG. 7, there is illustrated a schematic diagram of the program buffers 72 and 80 with each buffer corresponding to an input address line for either the X-addresses or the Y- or control addresses. An NPN transistor 158 has the collector thereof connected to $V_{CC}$ and the base thereof connected to the program enable signal through a resistor 160 and to the respective input pins through a series connected diode 162 with the cathode of diode 162 connected to the input pin. The emitter of transistor 158 is connected through a resistor 164 to the base of an NPN transistor 166, the base of transistor 166 connected to ground through a resistor 168. The emitter of transistor 166 is connected to ground and the collector thereof connected to the true form of the output decode bit and also to $V_{CC}$ through a resistor 170. The collector of transistor 166 is also connected to anode 172 through a series diode 174, with diode 174 having the cathode thereof connected to the collector of transistor 166. Node 172 is connected through a diode 176 to the base of an NPN transistor 178 and also to the program enable signal through a resistor 180.

The diode 176 has the cathode thereof connected to the base of transistor 178 with transistor 178 having the base thereof connected to ground through a resistor 182, the collector thereof connected to $V_{CC}$ through a resistor 184 and the emitter thereof connected to ground. The collector of transistor 178 comprises the inverse of the decode bit. Therefore, for each address bit input to the device in the programming mode, the programming buffers output the true and complimentary forms thereof. These are output to the respective decode lines for interconnection with one of the diodes on the actual Y-or X-decoders.

In normal operation of the preferred embodiment, all bit lines are selected and one-half of all the word lines are selected. The output logic circuitry combines these in a predetermined manner. When the program mode is entered, various pins are reconfigured as X-address, Y-address and control address pins with the X-address pins operable to select one of the word lines and the combined Y-address and control address pins operable to select one of the bit lines. Selection of a bit line and a word line results in opening of the associated fuse associated with that memory cell. This is due to the increased level of the $V_{CC}$ voltage.

In summary, there has been provided a programmable memory with the capability to individually program each memory cell with separate row and column addresses with row and column addresses being a binary address. Internal circuitry is provided for boosting the current through the selected memory cell in the programming mode such that the only thing required to program a cell in the program mode is to address it.

Although the preferred embodiment has been described in detail, it should be understood that various changes, substitutions and alterations can be made therein without departing from the spirit and scope of the invention as defined by the appended claims.

What is claimed is:

1. A programmable memory, comprising:
  a matrix of programmable memory cells arranged in rows and columns, each cell for storing first and second logic states with each of said cells normally in the first logic state and programmable to the second logic state, said matrix in an operating mode having output lines coupled to respective groups of said columns;
  operating means for addressing select ones of said memory cells in the operating mode in accordance with an input operating address and for combining the logic states of said address cells in accordance with a predetermined operating logic function for output from said memory;
  program enable means for placing the memory in a programming mode to program said memory cells;
  means for addressing each cell in said matrix in the programming mode to program said memory cells;
  programming means for changing the logic state of an addressed one of said memory cells from the first logic state to the second logic state, said programming means activated in response to addressing one of said memory cells without raising the voltage on any of said output lines such that each of said memory cells is programmed in the programming mode by addressing thereof.

2. The programmble memory of claim 1 wherein said programmable memory cells each comprise a transistor having an emitter collector path and a fuse disposed in series with the emitter collector path of said transistor for passing current therethrough when said memory cell is addressed, said programming means changing the logic state from said first logic state with the fuse intact to said second logic state with the fuse opened by passing a higher level of current therethrough in the programming mode relative to the current that is passed through said memory cell in the operating mode to open said fuse.

3. The programmable memory of claim 2 wherein said programming means comprises means for boosting the current through said memory cells relative to the current provided in the operating mode to cause said associated fuse to open.

4. The programmable memory of claim 3 wherein said means for addressing comprises a current source for being connected between said addressed memory cell and a current sink for sinking current from a reference voltage with said programming means increasing the current through said current sink.

5. The programmable memory of claim 1 and further comprising a plurality of input/output pins configurable in the operating mode for receiving said input operating address on select ones of said pins and providing said output on select ones of said pins and configurable in the programming mode to receive said external programming address on select ones of said pins, said program enable means further comprising multiplexing means for multiplexing the operation of said pins in either the operating mode or the programming mode such that said pins are configured in the operating mode to receive the input operating address for interface with said operating means and in the programming mode to receive said external programming address for interface with said means for addressing.

6. The programmable memory of claim 1 wherein said address means comprises:
   row address means for addressing one of the rows in said matrix in response to receiving an external row address signal;
   column address means for accessing a column of said memory cells in said matrix in response to receiving an external column address signal;
   said row and column address means operable only in the programming mode; and
   sense amp means associated with each of said columns in said matrix for sinking current through the associated one of said memory cells and sensing the level of current, said first logic state represented by current being passed through said associated memory cell and said second logic state being represented by no current flow through said associated memory cells.

7. The programmable memory of claim 6 wherein said programming means comprises means for increasing the current through said memory cell when said memory cell is accessed in the programming mode.

8. The programmable memory of claim 1 wherein said external programming address is binary.

9. A programmable memory, comprising:
   a supply voltage input for receiving an external supply voltage;
   a plurality of input/output pins configurable in an operating mode to receive operating input addresses on select ones of said pins and provide outputs on select ones of said pins, and configurable in a programming mode to receive programming input addresses on select ones of said pins;
   a matrix of programmable memory cells arranged in rows and columns, each memory cell comprising a transistor having a base and an emitter-collector path with a fuse in series with said emitter-collector path and addressable with an address signal coupled to the base thereof, each of said memory cells connected on one side thereof to said supply voltage input for drawing current therefrom, a first logic state represented by said fuse being intact to allow current to flow therethrough and a second logic state being represented by said fuse being opened to prevent current flowing therethrough;
   a current sink associated with each of the columns in said matrix for sinking current through an associated one of said memory cells in the first logic state from said supply voltage when said associated memory cell in the first logic state is addressed;
   sense amp means associated with each of said columns for sensing current flow through an accessed one of said memory cells associated therewith to determine if current flows through the accessed one of said memory cells;
   operating means for addressing select ones of said memory cells in the operating mode in accordance with an operating input address and for combining the logic states output by said sense amp means for said addressed memory cells in accordance with a predetermined logic function for output on the output ones of said pins;
   program enable means for placing the memory in the programming mode and configuring said input/output pins in the programming mode;
   row access means for addressing each of the rows in said matrix in the programming mode in response to receiving an external programming row address from said pins;
   column access means for accessing each of said columns in the programming mode in response to receiving an external program column address; and
   program means for increasing the current through the accessed one of said memory cells in the programming mode to a level sufficient to open the associated one of said fuses without raising the voltage on any of said output pins.

10. The programmable memory of claim 9 wherein said program means comprises means for increasing the current said current sink draws from said associated column and the addressed one of said memory cells in response to the supply voltage for said programmable memory being raised above a predetermined level.

11. The programmable memory of claim 10 wherein said programmable memory comprises circuit means connected in series with each of said current sinks associated with each of said columns for increasing the current that said current sink draws from said associated column and the addressed one of said memory cells and a zener diode connected between said circuit means and the supply voltage to the programmable memory with said zener diode configured such that increasing of the supply voltage beyond the zener breakdown voltage thereof causes increased current to flow to said circuit means, said circuit means activated in response to said zener diode having a voltage placed thereacross larger than said zener diode breakdown voltage.

12. The programmable memory of claim 11 wherein said program enable means operates in response to the supply voltage being increased above the zener breakdown voltage.

13. The programmable memory of claim 9 wherein said program row and column addresses are binary.

14. The programmable memory of claim 9 wherein said program enable means comprises a multiplexer for multiplexing said pins to configure said pins in the operating mode for interface with said operating means and in the programming mode to interface said pins with said row and column access means.

15. A method for programming memory cells in a matrix of programmable memory cells arranged in rows and columns and accessed by input and output lines, each cells for storing first and second logic states with each of the cells normally in a first logic state and programmable to the second logic state, comprising:

placing the matrix of memory cells in a programming mode;

addressing in the programming mode each cell in the matrix in accordance with an external programming address; and changing the logic state of the addressed one of the memory cells in the first logic state to the second logic state in response to addressing of one of the memory cells such that each of the memory cells is programmed in the programming mode by addressing thereof without having to raise the voltage on any of the output lines of said programmable memory.

16. The method of claim 15 wherein the step of addressing of memory cells comprises receiving an external row address and addressing one of the rows in the matrix;

receiving an external column address signal and accessing a column of the memory cells in the matrix;

sinking current from each one of the columns in the matrix; and sensing the current from each one of the columns, the first logic state represented by current passed through the associated memory cell and the second logic state being represented by no current flow through the associated memory cell.

* * * * *